United States Patent [19]
Avella et al.

[11] Patent Number: 4,608,354
[45] Date of Patent: Aug. 26, 1986

[54] SILICON NITRIDE SUBSTRATE

[75] Inventors: Frank J. Avella, Andover; Leslie J. Bowen, Concord, both of Mass.

[73] Assignee: GTE Laboratories Incorporated, Waltham, Mass.

[21] Appl. No.: 685,644

[22] Filed: Dec. 24, 1984

[51] Int. Cl.⁴ ............................................. C04B 35/58
[52] U.S. Cl. ........................................ 501/97; 264/65; 428/428
[58] Field of Search .................... 501/97, 154; 264/65

[56] References Cited

U.S. PATENT DOCUMENTS

| | | | |
|---|---|---|---|
| 3,839,540 | 10/1974 | Arrow | 501/97 |
| 3,992,497 | 11/1976 | Terwilliger et al. | 264/66 |
| 4,073,845 | 2/1978 | Buljan et al. | 264/65 |
| 4,264,547 | 4/1981 | De Pous | 264/65 |
| 4,280,850 | 7/1981 | Smith et al. | 501/154 |
| 4,364,100 | 12/1982 | Edmonds et al. | 361/395 |
| 4,401,617 | 8/1983 | Ezis et al. | 264/332 |
| 4,552,711 | 11/1985 | Raj et al. | 501/97 |
| 4,558,018 | 12/1985 | Matsuhiro et al. | 501/97 |

FOREIGN PATENT DOCUMENTS 2011952  7/1979  United Kingdom .................. 501/97

OTHER PUBLICATIONS

Kuriyama, M. et al, "Thermal Conductivity of $Si_3N_4$ by the Laser Flash Method", Proc. 5th Intnl. Conf. on Thermal Anal., Heyden & Sons, London, pp. 325–328 (1977).

Giachello, A. et al, *Sintering of Silicon Nitride in a Powder Bed*, J. Mat. Sci., 14(1979), pp. 2825–2830.

Thorp, J. T. et al, *Dielectric Properties of Some Hot-Pressed Nitrogen Ceramics*, J. Mat. Sci., 12(1977), pp. 2274–2280.

Mitomo, M. et al, *Thermal Conductivity of α-Sialon Ceramics*, J. Matl. Sci. Letters, 3(1984), pp. 915–916.

Toshiba Corporation, *Nitride Ceramics* Apr. 1984.

Xi et al., "The Heat Conduction Behavior of Hot-Pressed $Si_3N_4$ Related to Processing Conditions and Microstructure," Trans. J. Br. Ceram. Soc., 82(1983), pp. 175–177.

*Primary Examiner*—Helen M. McCarthy
*Attorney, Agent, or Firm*—Ivan L. Ericson

[57] ABSTRACT

A densified silicon nitride/magnesium oxide article which can be used as a substrate for a silicon device such as an integrated circuit chip is made by a unique process which imparts to the densified article of the combined properties of high relative density, low relative dielectric constant, low dielectric loss tangent, high thermal conductivity, thermal expansion coefficient matched to that of silicon, and a high modulus of rupture without hot pressing.

3 Claims, 1 Drawing Figure

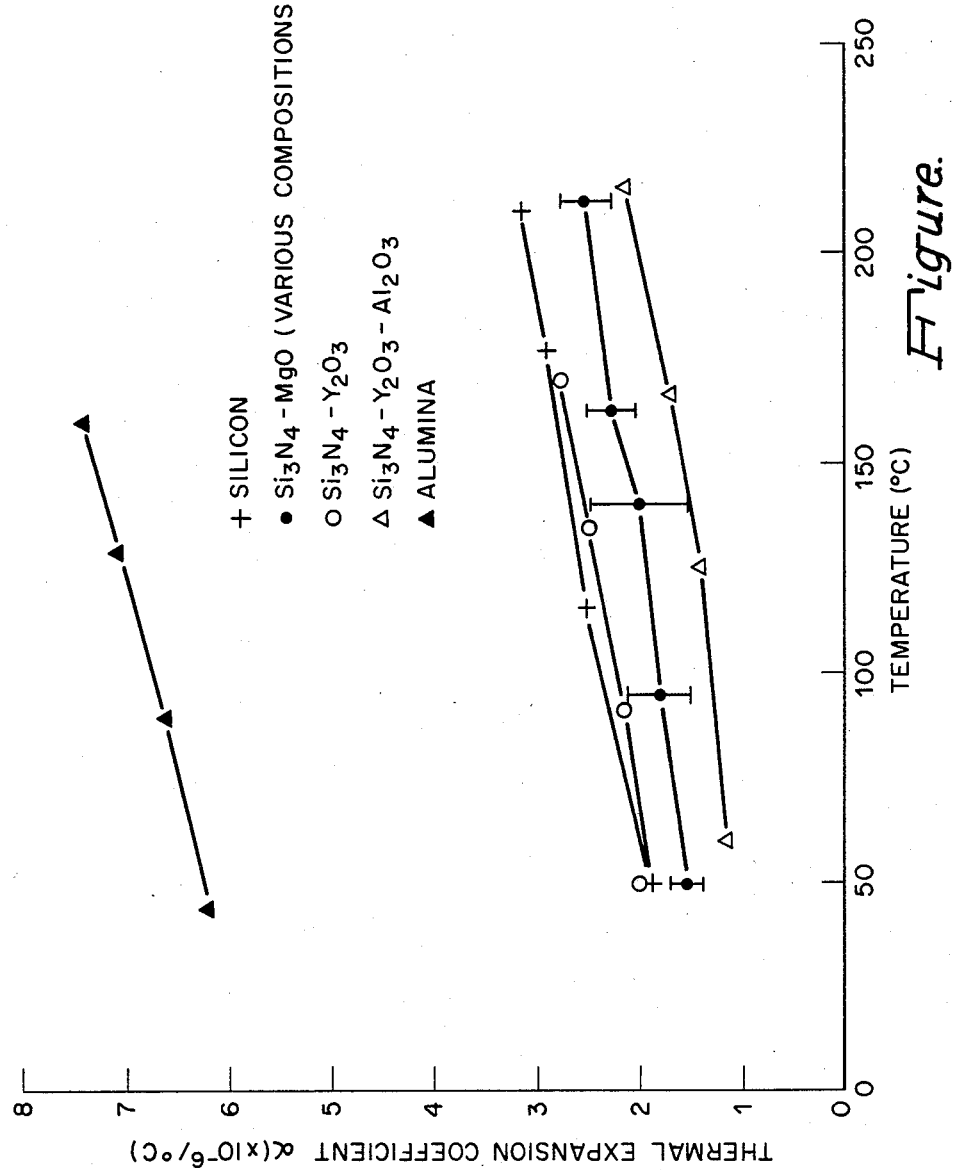

SILICON NITRIDE SUBSTRATE

FIELD OF THE INVENTION

This invention relates to a ceramic article and a process for making it. More particularly, it is concerned with a densified silicon nitride article used as a substrate for silicon microelectronic applications.

BACKGROUND OF THE INVENTION

It is desirable for the substrate for a microelectronic device, integrated circuit, silicon chip to have the following properties for the indicated reasons:
1. High relative density in excess of 97.5% of theoretical maximum to provide a smooth surface.
2. Low relative dielectric permittivity to allow rapid signal propagation rates.
3. Low dielectric loss tangent to limit signal attenuation.
4. High thermal conductivity to remove heat generated in the silicon chip
5. Thermal expansion coefficient matched to that of the silicon chip to prevent breakage of the chip or of the adhesive joints or bonds between the chip and the substrate.
6. A high modulus of rupture to prevent breakage of the substrate during handling such as with automatic assembly equipment or during insertion of contact pins into holes in the substrate.

Sintered silicon nitride containing $Y_2O_3$ and $Al_2O_3$ and expansion coefficient similar to that of silicon has been used as a substrate for a silicon chip (J. Cummings, E. Anderson, H. Vora, and R. Wagner, Proceedings of VLSI Packaging Workshop, Gaithersburg, MD, 9/12-13/83). Silicon nitride containing MgO has been sintered without hot-pressing to a relative density of 97.5% (A. Giachello, P. C. Martinengo, G. Tommasini and P. Popper, J. Mat. Sci. 14(1979) 2825–2830) and, if formulated with 20w/o crystalline $Si_3N_4$, to have a modulus of rupture in excess of 90,000 psi (U.S. Pat. No. 4,073,845). Hot pressed $Si_3N_4$/MgO was reported to have relative dielectric constant of 9.5 and dielectric loss tangent of 0.0055 at 0.1 MHz (J. S. Thorp and R. I. Sharif, J. Mat. Sci. 12(1977) 2274–2280). Hot-pressed $Si_3N_4$/MgO was reported to have thermal diffusivity of 0.08 cm s$^{-1}$ at 500° C. (T. G. Xi, Q. T. Chen, H. L. Ni, F. Y. Wu and T. S. Yen, Trans. J. Br. Ceram. Soc. 82 (1983) 175-177).

In addition, hot-pressed $Si_3N_4$/MgO was reported to have a thermal conductivity of 13.3 $\times 10^{-3}$ cal cm$^{-1}$sec$^{-1}$K$^{-1}$ or 55.6 Wm$^{-1}$K$^{-1}$ (M. Mitomo, N. Hirosaki, and T. Mitsuhashi, Journal of Materials Science Letters 3 (1984) 915-916.

Disadvantages of Prior Art $Si_3N_4$/MgO sintered without hot-pressing had maximum relative density of 97.5% of theoretical.

Previous $Si_3N_4$/MgO sintered materials, especially those made without hot-pressing, did not have the combination of properties which make them useful as substrates for use in packaging or supporting a silicon microelectronic chip or integrated circuit.

OBJECTS OF THE INVENTION

Accordingly, it is an object of the present invention to provide a new and improved ceramic substrate for silicon microelectronic chips or integrated circuits.

It is a further object of this invention to provide a new and improved method for making a silicon nitride article which can be used for a substrate for silicon microelectronic chips or integrated circuits.

Further and other objects of the present invention will become apparent from the description contained herein.

SUMMARY OF THE INVENTION

These and other objects and advantages are achieved in accordance with the present invention wherein there is provided a densified silicon nitride article containing from about 2 to about 15 w/o magnesia but preferably from about 4 to about 7.5 w/o magnesia. The densified silicon nitride article has a dielectric constant less than 8; a dielectric loss tangent less than 0.005; a thermal conductivity greater than 50 W/mK; a thermal expansion coefficient from about 70 to about 90% that of single crystal silicon measured to be 1.9ppm/°C. at 50° C.; a modulus of rupture greater than 70,000 psi and an absolute density from about 3.12 g cm$^{-3}$ to about 3.20 g cm$^{-3}$.

The densified silicon nitride article can be used as a substrate for silicon microelectronic chips and integrated circuits. The densified silicon nitride article is made in the following manner:

Silicon nitride powder is mechanically mixed with from about 2 to about 15 w/o of magnesium oxide sintering aid and an organic binder in an organic solvent. The resulting slurry is dried in an inert atmosphere and is then ball milled in the dry state. The milled powder is formed into compacts of desired dimensions followed by heating in air at a temperature and for a length of time sufficient to remove the organic binder to form compacts having a density from about 59% to about 65% of theoretical. The compacts are then sintered at an elevated temperature, 1650° C., either in slowly flowing nitrogen gas at ambient pressure or in a nitrogen gas overpressure. The resulting articles having densities greater than 97.5% of theoretical may be used as microelectronic substrates in the as-fired condition or they may be further processed such as by chemical and/or mechanical polishing.

In a preferred embodiment of the invention, the densified silicon nitride article is made by the following steps:

Step 1 —Silicon nitride powder, from about 2 to about 4 w/o stearic acid binder, from about 4 to about 7.5 w/o magnesium oxide, in methanol is ball milled for at least one hour with sintered silicon nitride milling media in polyethylene bottles to form a homogeneous slurry.

Step 2 —The homogeneous slurry from step 1 is dried in an inert atmosphere at a temperature equal to or less than 60° C. to form a dry powder.

Step 3 —The dry powder from step 2 is ball milled with sintered silicon nitride media for a time sufficient to reduce the average aspect ratio of acicular crystals of the powder to less than 3.

Step 4 —The product from step 3 is sieved through a 50 mesh sieve which is non-metallic.

Step 5 —The product from step 4 is pelletized by pressing at a pressure sufficient to form a pellet.

Step 6 —The product from step 5 is isostatically pressed from about 20,000 to about 26,000 psig.

Step 7 —The product from step 6 is baked in air at 600° C., for 15 hours to remove said stearic acid binder to form a green compact having a density from about 59% to about 65% of theoretical density.

Step 8 —The product from step 7 is sintered at about 1750° C. to about 1770° C. in a nitrogen atmosphere having an overpressure sufficient to densify to greater than 98% of theoretical density to form a densified silicon nitride article. Alternatively, the product from step 7 is sintered at about 1650° C. in a slowly flowing nitrogen atmosphere at ambient pressure to greater than 97.5% of theoretical density to form a densified silicon nitride article.

BRIEF DESCRIPTION OF THE DRAWING

In the drawing:

The single FIGURE is a curve of the thermal expansion coefficient of silicon, alumina, $Si_3N_4$—MgO made by the method of the present invention, $Si_3N_4$—$Y_2O_3$ and $Si_3N$—$Y_2O_3$—$Al_2O_3$.

For a better understanding of the present invention, together with other and further objects, advantages and capabilities thereof, reference is made to the following disclosure and appended claims in connection with the above-described drawings.

DETAILED DESCRIPTION OF THE INVENTION

EXAMPLE I

The $Si_3N_4$/MgO of the present invention was prepared by the following method:

| Component | Composition w/o | Amount |
|---|---|---|
| $Si_3N_4$ powder | 100 | 33.00 g |
| MgO powder | 5 | 1.65 g |
| Stearic Acid | 2 | 0.66 g |
| Methanol | — | 40 ml |
| ($Si_3N_4$—$Y_2O_3$—$Al_2O_3$) Sintered milling Media (15 g balls) | | 1000 g |

Powder Preparation $Si_3N_4$ powder and milling media are put into a 1-liter Nalgene bottle.

The stearic acid binder is dissolved in warmed methanol, MgO is slurried in, and the slurry is poured into the $Si_3N_4$ powder.

The mixture is milled to a creamy consistency for one hour on roller mill at 100 rpm.

The slurry is dried in the bottle for 16 hours in argon atmosphere at less than or equal to 60° C.

The powder is dry ball milled at 100 rpm for a time sufficient, such as 72 hrs., to reduce the average aspect ratio of acicular crystals of the powder to less than 3 and sufficient so that a green density after compacting is greater than 59% of theoretical.

The powder is separated from the balls and sieved thru 50 mesh Nytex cloth.

Formation of Test Compacts 1.1 g powder is pressed in a ⅜-inch diameter hardened steel die at 6500 psi.

The compacts are then isostatically pressed at 25,000 psi.

The stearic acid is burned out by baking in air at 600° C., for 15 hours (heat up at 3° C./min, cool down at 10° C./min).

This yields green densities of 59-65% theoretical density (which is 3.20 g cm$^{-3}$ for 5 w/o MgO).

Sintering

Sintering containers are graphite (EPB grade) boats with internal dimensions of 1.8″ W×2.0″ L×0.9″ D.

The boats with covers are conditioned by filling them with powder having approximately the same composition as the sample compacts and firing them in nitrogen at 1800° to 1900° C. for equal to or greater than 1 hour. This is repeated three or more times until a layer of $Si_3N_4$ coats the interior of the boat.

A conditioned boat is half filled with setter powder of the same composition as the sample compacts, and compacts are distributed across the powder bed. The compacts are then covered, and the boat is filled with more setter powder. The conditioned cover is then inserted.

Sintering is conducted in a carbon resistance tube furnace in an atmosphere of high purity nitrogen with the furnace pressurized to 3 atm. at ambient temperature. The temperature is raised to 1400° C. at an average rate of 10° C./min., held there for 1 hour, then raised to 1700–1770° C. at 10° C./min. and held there for 3 hours. The nitrogen pressure at those temperatures is from about 10 to about 11 atmospheres. The cooling rate is 15° C./min. to about 500° C., then it is at the inertial rate of the furnace.

EXAMPLE II

Powder preparation and compact formation is performed as described in Example I above, but sintering is conducted with nitrogen at ambient pressure.

The exit port of the furnace is fitted with a dry trap and a bubbler containing silicone vacuum pump oil. After flushing the system with nitrogen, the gas flow is reduced to 0.7-1 bubble/s (ca. 3–4×10$^{-4}$ l/s). The firing schedule is similar to that in Example I above, but the maximum temperature is reduced to 1650° C. and the hold time is extended to 5 hours.

Comments relating to the preparation

X-ray diffraction shows forsterite ($Mg_2SiO_4$) in our $Si_3N_4$/MgO samples whether sintered at low or high temperatures (1650–1770° C.).

The physical characteristics of the resulting densified $Si_3N_4$/MgO article of the present invention were measured.

1. Thermal Diffusivity and Conductivity

Table I summarizes the results of laser flash thermal diffusivity measurements obtained for polished and as-fired samples of $Si_3N_4$/MgO. 99.5% $Al_2O_3$ (GTE Wesgo type AL995) was included as a test control. All samples were disks with diameters between 0.51 and 0.52 inch and thicknesses between 0.08 and 0.10 inch, except for AL1995, $Al_2O_3$, with a thickness of 0.063 inch. Thermal conductivity was calculated as the product of diffusivity, bulk density and specific heat. In the case of $Si_3N_4$/MgO, specific heat was measured for samples from the same sintering runs, and the results indicated that samples sintered at 1770° C. or 1650° C., while differing in thermal diffusivity, showed little difference in specific heat. The specific heat-temperature relationships derived from the raw data by least squares and used in calculating thermal conductivity are as follows: $Si_3N_4$/MgO(5 w/o): $C_p = 0.25325 + 3.262 \times 1 0^{-4}T - 1.89966 \times 10^{-7}T^2$    AL995:

$C_p = 0.1466 + 8.199 \times 10^{-4}T - 3.591 \ 10^{-6}T^2 - 8.278 \times 10^{-9}T^{-3} - 6.516 \times 10^{-12}T^4$ Where $C_p$ is in cal/g°C. and T is in °C.

These tests show that silicon nitride prepared with 5 to 7.5 w/o magnesium oxide according to the methods of the invention disclosed herein produce values of thermal conductivity at 22-25° C. that are up to 3.1 times the value for alumina commonly used for microelectronic substrates.

2. Dielectric Properties

Measurements of relative permittivity (k') and loss tangent (tan D) were made on the samples listed in Table I, and these results are given in Table II. All samples were electroded with silver paint and baked at 175° C. for 30 minutes in air. Leads were attached with the same paint. Samples were conditioned at least 16 hours in a room maintained at 2% relative humidity at 20-22° C. and were tested there with an impedance analyzer at a frequency of 0.1 MHz.

The values of k' and tan D range from 7.2 and 0.0001 for some as fired samples to 7.9 and 0.0038 for one polished sample. This implies that the surface layers have lower k' and tan D than the interiors, since both k' and loss factor (k''=k' tan D) of layers in series add inversely. In comparison with other $Si_3N_4$ formulations, the polished MgO-containing samples have k' values at 0.1 MHz that are lower than that of $Si_3N_4$-$Y_2O_3$-$Al_2O_3$ and slightly lower or comparable to other grades of $Si_3N_4$-$Y_2O_3$. Tan D values also fall within the range obtained for those compositions. Measurements at 2.08 GHz, give k' and tan D values similar to those obtained at 0.1 MHz.

3. Thermal Expansion Coefficient

Coefficients of linear thermal expansion, $\alpha(10^{-6}/°C.)$, were obtained for several samples prepared with various compositions and conditions. Test bar dimensions were: 0.32-0.33" L×b 0.10" W×0.09" T. Measurements were made with a fused silica tube and push rod. Single crystal silicon acted as a test control. Test results between 50 and 210° C. are plotted in the Figure along with results obtained from silicon, 99.5% $Al_2O_3$ (AL995), and other $Si_3N_4$ types. The results for $Si_3N_4$/MgO are given within range indicated (error bars) to include several compositions and preparation conditions. The average coefficient is somewhat lower than that of silicon, but the samples sintered at 1770° C. generally gave the highest coefficients. At 50° C. the coefficients are within 70 to 90% that of silicon.

4. Modulus of Rupture

Modulus of rupture was measured on two samples sintered with 5 w/o MgO at 1650° C. to a density of 3.14 g $cm^{-3}$ Test bars (8 each) were cut to 1.00" L×0.10" W×0.05" T and measured at room temperature with an Instron Model No. 1127 using a 4-point configuration. The results were 73.2 ksi for one sample and 80.3 ksi for the other (11.34 and 9.38 Weibull). The values are lower than the 95 ksi value obtained for $Si_3N_4$—$Y_2O_3$—$Al_2O_3$ but 1.6-1.8 times that reported for 99.5% $Al_2O_3$ (AL995) The denser MgO-containing samples sintered above 1700° C. would be expected to yield higher modulus values.

TABLE I

Thermal Properties of $Si_3N_4$/MgO

| Sample No. | MgO (w/o) | Max. Sintering Temperature (°C.) | Density* (Archimedes) (g $cm^{-3}$) | Post-sinter Processing | Diffusivity ($cm^2 s^{-1}$) 22-25° C. | Diffusivity 190-210° C. | Conductivity ($Wm^{-1}K^{-1}$) 22-25° C. | Conductivity 190-210° C. |
|---|---|---|---|---|---|---|---|---|
| 1 | 5 | 1770 | 3.16 | polished | 0.3376 | 0.2118 | 71.8 | 59.2 |
| 1 | 5 | 1770 | " | as-fired | 0.3224 | (0.1887 at 221° C.) | 68.5 | (54.4 at 221) |
| 2 | 5 | 1770 | " | annealed 1300° C., polished | 0.3307 | 0.1918 | 70.3 | 53.9 |
| 3 | 7.5 | 1750 | " | polished | 0.3362 | 0.2178 | 70.8 | 60.2 |
| 4 | 4 | 1750 | 3.14 | as-fired | 0.3069 | 0.1861 | 64.3 | 51.8 |
| 5 | 2 | 1750 | 3.14 | as-fired | 0.2023 | 0.1406 | 43.5 | 37.9 |
| 6 | 5 | 1650 | 3.08 | as-fired | 0.2359 | 0.1420 | 48.6 | 38.7 |
| 7 | 5 | 1650 | 3.16 | polished | 0.2608 | 0.1830 | 55.5 | 51.1 |
| 8 | AL995 Alumina | | | | 0.0876 | (0.0428 at 225° C.) | 23.1 | (15.6 at 225° C.) |

*Theoretical density for 5 w/o MgO is 3.20 g $cm^{-3}$.

TABLE II

Dielectric Properties of $Si_3N_4$ (at 0.1 MHz)

| Sample No.* | Relative Permittivity As-Fired | Relative Permittivity Polished | Loss Tangent As-Fired | Loss Tangent Polished |
|---|---|---|---|---|
| 1 | 7.55 | 7.63 | 0.0024 | 0.0026 |
| 2 | 7.17 | 7.84 | ≦0.0001 | 0.0002 |
| 3 | 7.49 | 7.87 | " | " |
| 4 | 7.71 | — | " | — |
| 5 | 7.47 | — | " | — |
| 6 | 7.23 | — | " | — |
| 7 | 7.41 | 7.63 | 0.0002 | 0.0038 |
| AL995 (Alumina) | 9.84 | — | ≦0.0001 | — |

*See Table I for sample identification.

The $Si_3N_4$/MgO of the present invention prepared by the above described method has the following unique characteristics. A combination of low relative dielectric constant (<8), low dielectric loss tangent (<0.005), high thermal conductivity (>50W/mK), thermal expansion coefficient (1.5-2 ppm/°C.) close to that of silicon, and high modulus of rupture (above 80,000 psi) and a density above 3.12 g $cm^{-3}$ and up to 3.16 g $cm^{-3}$ (98.8% of 3.20 g $cm^{-3}$ theoretical density of $Si_3N_4$ +5 w/o MgO) without hot-pressing.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. A method of making a densified silicon nitride article having a low relative dielectric constant, a low dielectric loss tangent, a high thermal conductivity, a thermal expansion coefficient similar to silicon, and a high modulus of rupture comprising the steps of:

Step 1—ball milling silicon nitride powder, from about 2 to about 15 w/o magnesium oxide, and an organic binder in an organic solvent to form a homogeneous slurry;

Step 2—drying the homogeneous slurry from step 1 in an inert atmosphere to form a dry powder;

Step 3—dry ball milling the product from step 2;

Step 4—compacting the product from step 3 to form a compact;

Step 5—heating the product from step 4 in air at a temperature and for a length of time sufficient to remove the organic binder to form a green compact having a density from about 59% to about 65% of theoretical density; and Step 6—sintering the product from step 5 at a temperature equal to or greater than 1,650° C. in a nitrogen atmosphere and for a time sufficient to form a densified silicon nitride article having a density greater than 97.5% of theoretical.

2. A densified silicon nitride article consisting essentially from about 2 to about 15 w/o magnesia with the remainder being silicon nitride, said silicon nitride article having a dielectric constant less than 8, a dielectric loss tangent less than 0.005, a thermal conductivity greater than 50 W/mK, a thermal expansion coefficient from about 70 to about 90% of silicon, a modulus of rupture greater than 70,000 psi and an absolute density from about 3.12 g cm$^{-3}$ to about 3.20 gm cm$^{-3}$, the densified silicon nitride article being made by the steps following:

Step 1—ball milling silicon nitride powder, from about 2 to about 15 w/o magnesium oxide, and an organic binder in an organic solvent to form a homogeneous slurry;

Step 2—drying the homogeneous slurry from step 1 in an inert atmosphere to form a dry powder;

Step 3—dry ball milling the product from step 2;

Step 4—compacting the product from step 3 to form a compact;

Step 5—heating the product from step 4 in air at a temperature and for a length of time sufficient to remove the organic binder to form a green compact having a density from about 59% to about 65% of theoretical density; and Step 6—sintering the product from step 5 at a temperature equal to or greater than 1,650° C. in a nitrogen atmosphere and for a time sufficient to form a densified silicon nitride article having a density greater than 97.5% of theoretical.

3. A silicon nitride substrate for silicon microelectronic chips made from the densified silicon nitride article in accordance with claim 2.

* * * * *